(12) United States Patent
Jing et al.

(10) Patent No.: US 11,292,934 B2
(45) Date of Patent: *Apr. 5, 2022

(54) FLUOROPOLYMER COATINGS COMPRISING AZIRIDINE COMPOUNDS AND NON-FLUORINATED POLYMER

(71) Applicant: 3M INNOVATIVE PROPERTIES COMPANY, St. Paul, MN (US)

(72) Inventors: Naiyong Jing, Woodbury, MN (US); Kevin M. Hamer, St. Paul, MN (US); Jeffrey A. Peterson, North St. Paul, MN (US); Thomas J. Blong, Woodbury, MN (US); Timothy D. Fletcher, Lino Lakes, MN (US); Michael Juergens, Moenchengladbach (DE); Mark W. Muggli, Emmerting (DE); Gezahegn D. Damte, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 244 days.

This patent is subject to a terminal disclaimer.

(21) Appl. No.: 16/696,015

(22) Filed: Nov. 26, 2019

(65) Prior Publication Data
US 2020/0095450 A1 Mar. 26, 2020

Related U.S. Application Data (63) Continuation of application No. 14/911,358, filed as application No. PCT/US2014/062771 on Oct. 29, 2014, now Pat. No. 10,526,503.

(60) Provisional application No. 61/901,016, filed on Nov. 7, 2013.

(51) Int. Cl.
| | |
|---|---|
| C09D 127/18 | (2006.01) |
| C09D 127/16 | (2006.01) |
| H01L 31/049 | (2014.01) |
| C09D 127/12 | (2006.01) |
| C08L 75/04 | (2006.01) |

(52) U.S. Cl.
CPC ......... C09D 127/18 (2013.01); C09D 127/12 (2013.01); C09D 127/16 (2013.01); H01L 31/049 (2014.12); C08L 75/04 (2013.01); Y02E 10/50 (2013.01)

(58) Field of Classification Search
CPC ............................ C09D 127/18; C09D 127/16
USPC ....................................................... 524/493
See application file for complete search history.

(56) References Cited

U.S. PATENT DOCUMENTS

| | | | |
|---|---|---|---|
| 3,235,544 A | 2/1966 | Christen | |
| 3,243,429 A | 3/1966 | Ham | |
| 4,152,165 A | 5/1979 | Langager | |
| 4,338,377 A | 7/1982 | Beck | |
| 5,073,404 A | 12/1991 | Huang | |
| 5,126,394 A | 6/1992 | Revis | |
| 5,221,497 A | 6/1993 | Watanabe | |
| 5,597,512 A | 1/1997 | Watanabe | |
| 5,880,204 A | 3/1999 | McCarthy | |
| 6,943,228 B2 | 9/2005 | Grootaert | |
| 7,323,514 B2 | 1/2008 | Jing | |
| 7,351,471 B2 | 4/2008 | Jing | |
| 8,017,666 B2 | 9/2011 | Bissinger | |
| 8,025,928 B2 | 9/2011 | Snow | |
| 8,048,518 B2 | 11/2011 | Debergalis | |
| 9,221,990 B2 | 12/2015 | Jing | |
| 9,577,206 B2 | 2/2017 | Yamae | |
| 2005/0113527 A1 | 5/2005 | Perella | |
| 2006/0054053 A1* | 3/2006 | Masutani | C09D 5/00 525/50 |
| 2006/0147177 A1 | 7/2006 | Jing | |
| 2006/0148996 A1 | 7/2006 | Coggio | |
| 2007/0154704 A1 | 7/2007 | Debergalis | |
| 2008/0319122 A1 | 12/2008 | Filiatrault | |

(Continued)

FOREIGN PATENT DOCUMENTS

| | | |
|---|---|---|
| CN | 1637087 | 7/2005 |
| CN | 102746754 | 10/2012 |

(Continued)

OTHER PUBLICATIONS

3M, Dyneon, Fluoroplastic THV 340Z, Dyneon Product Catalogue, 1 pg.
3M, Dyneon, Fluoroplastic THV 340Z, Preliminary Technical Information, 2 pgs.
KYNAR, A Water-Based Fluoropolymer Platform, 2011, 4 pgs.
Database WPI, Week 201355, Thomson Scientific, London, GB; AN 2012-K51284, XP002734101, & KR 2012 0086225 A (Toray Aovanceo Materials Korea Inc), Aug. 2, 2012 (Aug. 2, 2012).
Database WPI, Week 201355, Thomson Scientific, London, GB; AN 2012-K51279, XP002734102, & KR 2012 0086226 A (Toray Aovanceo Materials Korea Inc) Aug. 2, 2012 (Aug. 2, 2012).
Database WPI, Week 200134, Thomson Scientific, London, GB; AN 2001-321263 XP002734103, & JP 2001 072819 A (Daikin Kogyo KK) Mar. 21, 2001 (Mar. 21, 2001).

(Continued)

Primary Examiner — Deve V Hall
(74) Attorney, Agent, or Firm — Carolyn A. Fischer (57) ABSTRACT

A fluoropolymer coating composition is described comprising an aqueous liquid medium, fluoropolymer particles dispersed in the aqueous liquid medium, and at least one aziridine compound. The aziridine compound comprises at least two aziridine groups (i.e. polyaziridine) or at least one aziridine group and at least one alkoxy silane group. In another embodiment, an article is described comprising a substrate wherein a surface of the substrate comprises a coating comprising fluoropolymer particles; and a reaction product of at least one aziridine compound comprising at least two aziridine groups or at least one aziridine group and at least one alkoxy silane group. The coating can be utilized as a primer for bonding a non-fluorinated substrate to a fluoropolymer film and/or the coating can be used as an (e.g. outer exposed) surface layer. In some embodiments, the article may be the (e.g. backside) film of a photovoltaic module.

20 Claims, 2 Drawing Sheets

(56) References Cited

U.S. PATENT DOCUMENTS

| | | |
|---|---|---|
| 2010/0175742 A1 | 7/2010 | Burchill |
| 2011/0034604 A1 | 2/2011 | Hintzer |
| 2011/0086954 A1 | 4/2011 | Snow |
| 2011/0251332 A1 | 10/2011 | Allen |
| 2014/0318617 A1 | 10/2014 | Nakagawa |

FOREIGN PATENT DOCUMENTS

| | | |
|---|---|---|
| CN | 103275570 | 9/2013 |
| EP | 2 208 755 | 7/2010 |
| JP | H10-204253 | 8/1998 |
| JP | 2001-072819 | 3/2001 |
| JP | 2010-045376 | 9/2009 |
| JP | 2010-238759 | 10/2010 |
| JP | 2012-231029 | 11/2012 |
| JP | 2013-082925 | 5/2013 |
| KR | 2012-0086225 | 8/2012 |
| KR | 2012-0086226 | 8/2012 |
| WO | WO 2006-001691 | 1/2006 |
| WO | WO 2006-073785 | 7/2006 |
| WO | WO 2006-073918 | 7/2006 |
| WO | WO 2006-083425 | 8/2006 |
| WO | WO 2007-108905 | 9/2007 |
| WO | WO 2008-133848 | 11/2008 |
| WO | WO 2008-156978 | 12/2008 |
| WO | WO 2010-051149 | 5/2010 |
| WO | WO 2011-131547 | 10/2011 |
| WO | WO 2013-089926 | 6/2013 |
| WO | WO 2015-066868 | 5/2015 |
| WO | WO 2015-069502 | 5/2015 |

OTHER PUBLICATIONS

Database CA [Online] Chemical Abstracts Service, Columbus, Ohio, US; Imoto, Katsuhiko et al: "Room temperature-curable water-based fluoropolymer coating compositions", retrieved from STN Database accession No. 2005:100331 O ; & JP 2005 248157 A (Daikin IND Ltd) Sep. 15, 2005 (Sep. 15, 2005).

Milker, "New Generation of Multifunctional Crosslinkers", Pressure Sensitive Tape Council, pp. 53-80.

Nalco, General Product Information, Nalco Chemical Company, 1999, 1 pg.

Parker, "Water-Based FEVE Resin Technology for Performance Improvement in Architectural Coatings", AGC Chemicals, 2012, 39 pgs.

Xama 7, Polyfunctional Aziridine, 2004, 2pgs, XP055160058.

Xama 7 product information sheet, Nov. 2004.

International Search Report for PCT International Search Report PCT/US2014/062771, dated Jan. 15, 2015, 4 pgs.

* cited by examiner

FLUOROPOLYMER COATINGS COMPRISING AZIRIDINE COMPOUNDS AND NON-FLUORINATED POLYMER

CROSS REFERENCE TO RELATED APPLICATIONS

This application is a continuation of U.S. application Ser. No. 14/911,358, filed Feb. 10, 2016, which is a national stage filing under 35 U.S.C. 371 of PCT/US2014/062771, filed Oct. 29, 2014, which claims the benefit of U.S. Application No. 61/901,016, filed Nov. 7, 2013, the disclosure of which is incorporated by reference in its/their entirety herein.

SUMMARY

In one embodiment, a fluoropolymer coating composition is described comprising an aqueous liquid medium; fluoropolymer particles dispersed in the aqueous liquid medium; non-fluorinated polymer particles dispersed in the aqueous liquid medium; and at least one aziridine compound. The aziridine compound comprises at least two aziridine groups (i.e. polyaziridine) or at least one aziridine group and at least one alkoxy silane group.

In another embodiment, an article is described comprising a substrate wherein a surface of the substrate comprises a coating comprising fluoropolymer particles; non-fluorinated polymer particles; and a reaction product of at least one aziridine compound comprising at least two aziridine groups or at least one aziridine group and at least one alkoxy silane group. The coating can be utilized as a primer for bonding a non-fluorinated substrate to a fluoropolymer film and/or the coating can be used as an (e.g. outer exposed) surface layer. In some embodiments, the article may be the (e.g. backside) film of a photovoltaic module.

DETAILED DESCRIPTION

The following definitions apply throughout the specification and claims.

The term "aqueous" means that the liquid of the coating contains at least 50, 60, 70, or 80 percent by weight of water. It may contain a higher amount of water such as, for example, at least 85, 90, 95, or even at least 99 percent by weight of water or more. The aqueous liquid medium may comprise a mixture of water and one or more water-soluble organic cosolvent(s), in amounts such that the aqueous liquid medium forms a single phase. Examples of water-soluble organic cosolvents include methanol, ethanol, isopropanol, 2-methoxyethanol, 3-methoxypropanol, 1-methoxy-2-propanol, tetrahydrofuran, and ketone or ester solvents. The amount of organic cosolvent typically does not exceed 50, 40, 30, 20, or 15 wt.-% of the total liquids of the coating composition. The aqueous coating composition described herein typically comprises at least 15 wt-% and typically no greater than about 80 wt-% aqueous liquid medium. In some embodiments, the aqueous coating comprises no greater than 70 wt.-%, 60 wt.-%, 50 wt.-%, or 40 wt.-% aqueous liquid medium.

The term "nanoparticles" refers to particles with an average particle size of less than or equal to about 100 nanometers (nm).

A "dried" coating is a coating that has been applied from a coating composition that includes a liquid carrier (i.e. water and optionally cosolvent), and the liquid carrier has been substantially completely removed, for example by evaporation. A dried coating may also be cured (i.e., cross-linked) as a result of reaction between the reactive functional groups of the fluoropolymer and the aziridine compound, for example during evaporation. The rate and degree of curing can typically be enhanced by heating the coating composition during or after the drying process.

The term "liquid" means liquid at a temperature of 25° C. and a pressure of 1 atm.

The term "polyurethane" includes any polymeric material that comprises polyurethane segments. The term "polyurethane segment" refers to at least two urethane and/or urea groups that are connected by an organic group.

The term "acrylic polymer" includes any polymer or copolymer of acrylic acid, methacrylic acid, ester of these acids or acrylonitrile.

The aqueous coating composition described herein comprises at least one fluoropolymer.

Fluoropolymers comprise multiple carbon-fluorine bonds and are generally prepared from at least one fluorinated monomer. Examples of fluorinated monomers that may be polymerized include fluorinated olefins such as tetrafluoroethylene (TFE), chlorotrifluoroethylene (CTFE), hexafluoropropylene (HFP), 1-fluoro ethylene, otherwise known as vinyl fluoride (VF); 1,1-difluoro ethylene, otherwise known as vinylidene fluoride (VDF, VF2); partially or fully fluorinated allyl ethers; and partially or fully fluorinated vinyl ethers. The polymerization may further comprise non-fluorinated monomers such as ethylene, propylene, and non-fluorinated vinyl ethers.

Examples of fluorinated allyl ethers that can be used include those corresponding to the general formula:

wherein $R_f$ represents a perfluorinated aliphatic group that may contain one or more oxygen atoms.

Fluorinated vinyl ethers monomers include those corresponding to the formula:

wherein $R_f$ represents a perfluorinated aliphatic group that may contain one or more oxygen atoms. In some embodiments, the perfluorovinyl ethers correspond to the general formula:

wherein $R_f$ and $R'_f$ are different linear or branched perfluoroalkylene groups of 2-6 carbon atoms, m and n are independently 0-10, and $R''_f$ is a perfluoroalkyl group of 1-6 carbon atoms. Examples of perfluorovinyl ethers according to the above formulas include perfluoro-2-propoxypropyl-vinyl ether (PPVE-2), perfluoro-3-methoxy-n-propylvinyl ether, perfluoro-2-methoxy-ethylvinyl ether, perfluoromethylvinyl ether (PMVE), perfluoro-n-propylvinyl ether (PPVE-1) and $CF_3-(CF_2)_2-O-CF(CF_3)-CF_2-O-CF(CF_3)-CF_2-O-CF=CF_2$.

The fluorine content of the fluoropolymer is typically at least 60, 65, 66, 67, 68, 69, or 70 wt-% of the fluoropolymer and typically no greater than 77 wt-%.

The aqueous fluoropolymer coating composition preferably comprises a waterborne fluoropolymer, e.g. a fluoropolymer derived from an aqueous emulsion polymerization of at least one fluorinated monomer and an initiator as described for example in US2011/0034604; incorporated herein by reference. Waterborne fluoropolymers typically comprise small concentrations of polar functional groups including hydroxyl and carboxylate groups. For example, the uses of sulfinates, such as ammonium perfluorobutyl sulfinate, as part of the initiator system can produce such polar groups.

In some embodiments, the fluoropolymer comprises at least about 0.01, 0.02, 0.03, 0.04, or 0.05 up to 0.1 mole % of polar functional groups including hydroxyl and/or carboxylate groups. The non-fluorinated polymer also includes such polar functional groups. The hydroxyl and/or carboxylate groups are surmised to crosslink with aziridine groups of the polyaziridine compound, thereby crosslinking the fluoropolymer to the non-fluorinated polymer.

The coating composition comprises an aqueous fluoropolymer latex dispersion of one type of fluoropolymer or a blend of the various fluoropolymers as described herein.

In some embodiments, the fluoropolymer is a homopolymer of a fluorinated monomer such as polytetrafluoroethylene. In other embodiments, the fluoropolymers is a copolymer of two or more fluorinated monomers. In yet other embodiments, the fluoropolymer is a copolymer of one or more fluorinated monomers and at least one non-fluorinated monomer. For example, the fluoropolymer may be a copolymer of TFE and ethylene; or a copolymer of TFE, hexafluoropropylene (HFP), and ethylene.

In some embodiments, the coating composition comprises and/or consists of fluoropolymer(s) having repeat units derived from TFE and/or CTFE and monomeric units derived from non-fluorinated or fluorinated vinyl ethers. In some embodiments, the molar amount of TFE and/or CTFE is at least 55, 60, 65, or 70 mole % of the fluoropolymer. Fluoropolymers of this type may be substantially free of monomeric units derived from vinyl fluoride (VF) and/or vinylidene fluoride (VDF, VF2).

In some embodiments, the fluoropolymer of the coating composition comprises at least 5, 10, 15, 20, 25, 30, or 35 mole % of monomeric units derived from a non-fluorinated vinyl ether monomer. A commercially available fluoropolymer of this type is a water-based fluoroethylene vinyl ether copolymer available from Zhenbang Co. (Dalian, China) under the trade designation "Lumiflon ZBF500-1".

In some embodiments, fluoropolymers useful in the present invention comprise monomeric (e.g. repeat) units derived from vinyl fluoride (VF) and/or vinylidene fluoride (VDF, VF2). In some embodiments, the fluoropolymer is a homopolymer derived from VF and/or vinylidene fluoride. In other embodiments, the fluoropolymer is a copolymer of VF and/or VDF and at least one other comonomer.

The molar percentage of vinylidene fluoride of the copolymer is typically at least 30 or 35 and typically no greater than 60 mole %. In some embodiments, the molar amount of vinylidene fluoride is no greater than 50 mole %. In some embodiments, the fluoropolymer is a copolymer formed from the monomers tetrafluoroethylene (TFE), hexafluoropropylene (HFP), and vinylidene fluoride (VDF, VF2). Such monomer structures are shown as follows:

TFE: $CF_2=CF_2$

VDF: $CH_2=CF_2$

HFP: $CF_2=CF-CF_3$

The fluoropolymer may comprise or consist of monomeric (e.g. repeat) units derived from these three particular monomers in varying molar amounts. Such fluoropolymer may have the general formula:

wherein x, y and z are expressed as molar percentages.

For some embodied thermoplastic fluoropolymers, x (i.e. TFE) is greater than zero and typically at least 20, 25, or 30 molar percent of the fluoropolymer. In some embodiments, x is no greater than 60 or 55. In other embodiments, x is not greater than 50 mole %. The molar amount of y (i.e. HFP) is typically at least 5, 6, 7, 8, 9, or 10 and less than about 15 molar percent. Further, in some embodiments the molar amount of z (i.e. VDF) is at least 30 or 35 and typically no greater than 60. In some embodiments, y is no greater than 50.

In some embodiments, the coating composition comprises fluoropolymer(s) having monomeric (e.g. repeat) units derived from tetrafluoroethylene ("TFE"), hexafluoropropylene (HFP), and vinylidene fluoride (VDF, VF2). Examples of such commercially available fluoropolymers are available from 3M under the trade name Dyneon™ Fluoroplastic THV™ 200; Dyneon™ Fluoroplastic THV™ 300; Dyneon™ Fluoroplastic THV™ 400; Dyneon™ Fluoroplastic THV™ 500; and Dyneon™ Fluoroplastic THV™ 800 described in U.S. Pat. No. 7,323,514.

In other embodiments, the fluoropolymer is formed from the monomers vinyl fluoride (VF) and/or vinylidene fluoride ("VDF," "VF2,") such that the amount is greater than 55, 60, 65, or 70 mole % of the fluoropolymer. Representative fluoropolymer of this type are commercially available from Arkema Inc. Philadelphia, Pa. under the trade designation.

In some embodiments, the fluoropolymers lack reactive functionality (i.e. other than carboxylate or hydroxyl functionality) derived from inclusion of a cure-site monomer. In other embodiments, the fluoropolymers comprise reactive functionality derived from inclusion of a cure-site monomer.

The aqueous emulsion polymerization of the fluoropolymer may involve comonomers that have a functional group such as for example a group capable of participating in a peroxide cure reaction. Such functional groups include halogens such as Br or I.

Specific examples of such comonomers that may be listed here include (a) bromo- or iodo-(per)fluoroalkyl-(per)fluorovinylethers having the formula:

wherein each X may be the same or different and represents H or F, Z is Br or I, $R_f$ is a (per)fluoroalkylene $C_1-C_{12}$, optionally containing chlorine and/or ether oxygen atoms; for example: $BrCF_2-O-CF=CF_2$, $BrCF_2CF_2-O-CF=CF_2$, $BrCF_2CF_2CF_2-O-CF=CF_2$, $CF_3CFBrCF_2-O-CF=CF_2$, and the like; and (b) bromo- or iodo containing fluoroolefins such as those having the formula:

$$Z'—(R_f)_r—CX=CX_2,$$

wherein each X independently represents H or F, Z' is Br or I, $R_f$ is a perfluoroalkylene $C_1$-$C_{12}$, optionally containing chlorine atoms and r is 0 or 1; for instance: bromotrifluoroethylene, 4-bromo-perfluorobutene-1, and the like; or bromofluoroolefins such as 1-bromo-2,2-difluoroethylene and 4-bromo-3,3,4,4-tetrafluorobutene-1.

The aqueous emulsion polymerization of the fluoropolymer may involve comonomers that have a functional group. Nitrile groups can be "cured" by catalyzing trimerization to triazines.

Examples of nitrile containing monomers that may be used include those that correspond to one of the following formulas:

$$CF_2=CF—CF_2—O—R_f—CN$$

$$CF_2=CFO(CF_2)_LCN$$

$$CF_2=CFO[CF_2CF(CF_3)O]_g(CF_2)_vOCF(CF_3)CN$$

$$CF_2=CF[OCF_2CF(CF_3)]_kO(CF_2)_uCN$$

wherein L represents an integer of 2 to 12; g represents an integer of 0 to 4; k represents 1 or 2; v represents an integer of 0 to 6; u represents an integer of 1 to 6, $R_f$ is a perfluoroalkylene or a bivalent perfluoroether group. Specific examples of nitrile containing liquid fluorinated monomers include perfluoro(8-cyano-5-methyl-3,6-dioxa-1-octene), $CF_2=CFO(CF_2)_5CN$, and $CF_2=CFO(CF_2)_3OCF(CF_3)CN$.

In some embodiments, the fluoropolymer may involve comonomers that have a (e.g. halogen) functional group such as for example a group capable of being crosslinked by a multi-(meth)acrylate compound, such as described in U.S. Pat. No. 7,323,514. The multi-(meth)acrylate crosslinker typically comprises at least two (meth)acrylate groups. Representative compounds include the same multi-(meth)acrylate compound that can be used for the preparation of the polyaziridine compound by Michael addition as will subsequently be described.

The aqueous emulsion polymerization may be used to produce a variety of fluoropolymers including perfluoropolymers, which have a fully fluorinated backbone, as well as partially fluorinated fluoropolymers. The aqueous emulsion polymerization may result in melt-processable fluoropolymers as well as those that are not easily melt-processable such as for example polytetrafluoroethylene and so-called modified polytetrafluoroethylene. The polymerization process can further yield fluoropolymers that can be cured to make fluoroelastomers as well as fluorothermoplasts. Fluorothermoplasts are generally fluoropolymers that have a distinct and well noticeable melting point, typically in the range of 60 to 320° C. or between 100 and 320° C. Thus, they have a substantial crystalline phase. Fluoropolymers that are used for making fluoroelastomers typically are amorphous and/or have a negligible amount of crystallinity such that no or hardly any melting point is discernible for these fluoropolymers. The glass transition temperature (Tg) of commercially available fluoropolymer elastomers typically ranges from room temperature to about −40° C.

In some embodiments, the thermoplastic fluoropolymers have a melt temperature ranging from about 200° C. to about 280° C., 290° C., 300° C., or 325° C. In this embodiment, the melt temperature can be at least 210° C., 215° C., 220° C., or 225° C. In other embodiments, the melt temperature ranges from about 110° C. to about 180° C. In this embodiment, the melt temperature can be at least than 125° C., 130° C., 135° C. or 140° C. The melt temperature of the fluoropolymer is related to the temperature at which the dried coating can be heat laminated to another thermoplastic material, such as an (e.g. EVA) encapsulant and/or (e.g. PET) polymeric substrate film (e.g. of a photovoltaic cell). In some embodiments, a fluoropolymer having a melt temperature less than 130° C., or 125° C., or 120° C. is blended with a fluoropolymer having a melt temperature greater than 130° C., 140° C., 150° C., 160° C. In other embodiments, a fluoropolymer having a melt temperature less than 130° C., or 125° C., or 120° C. is blended with a fluoropolymer having a melt temperature greater than 200° C., 250° C., 275° C., or 300° C. Such blends can provide a relatively low heat lamination temperature in combination with good mechanical properties and durability.

The aqueous coating composition described herein comprise at least one non-fluorinated polymer. Favored non-fluorinated polymer dispersions include polyurethane polymer dispersions, acrylic polymer dispersions, polyolefin dispersion, polyethylene and polypropylene dispersions and their copolymer dispersions including ethylene-vinyl acetate copolymer dispersions, epoxy dispersions, phenolic dispersions, polyimide and polyamide dispersions, vinyl chloride dispersions and mixture thereof. Such polymers are typically thermoplastic.

In some embodiments, the polyurethane dispersion comprises a polyester backbone, a polycarbonate backbone, a polyester carbonate or a combination thereof. In other embodiments, the acrylic dispersion comprises an acrylic backbone, a hydroxyl-containing acrylic backbone, or a combination thereof. In yet other embodiments, the polymeric dispersion is a urethane-acrylic hybrid, or polycarbonate urethane/acrylic hybrid. In some embodiments, the polymers are described as having a polycarbonate or carbonate backbone. In such embodiments, the polymer comprises aliphatic or aromatic carbonate moieties, such as bisphenol A carbonate moieties. A mixture of non-fluorinated polymers may be employed such as a mixture of a polyurethane and an acrylic polymer.

Various processes have been developed for the preparation of waterborne or aqueous polymeric dispersions. In the preparation of aqueous polyurethane polymers, typically a medium molecular weight polymer (e.g. prepolymer) is formed by the reaction of suitable diols or polyols with a molar excess of diisocyanates or polyisocyanates in the presence of an internal emulsifier. The internal emulsifier is typically a diol with an ionic group (carboxylate, sulfonate, or quaternary ammonium slat) or a non-ionic group, such as poly(ethylene oxide). Aqueous polyurethane dispersions are typically one of three types, i.e. non-ionic, cationic, and anionic depending on the type of hydrophilic groups or segments present in the polyurethane backbone. In the case of anionic polyurethanes, dimethyol propionic acid (DMPA) is commonly incorporated into the polyurethane backbone due to its effectiveness for water dispersions in the subsequent neutralization reactions with triethylamine. The carboxylate ion of DMPA in the polymer is hydrophilic and serves an anionic center as well an internal emulsifier. Carboxylic ions not only stabilize aqueous polyurethane dispersions, but also provide curing sites. Aqueous acrylic polymers are also typically prepared with an internal emulsifier (e.g. acrylic acid units) and thus typically also comprise carboxylate ions to stabilize the dispersion and provide curing sites.

The molecular weight of the non-fluorinated polymer (e.g. polyurethane or acrylic) is typically at least 100,000; 150,000 or 200,000 g/mole. In typical embodiments, the molecular weight is no greater than 500,000 g/mole.

Examples of commercially available aqueous aliphatic polyurethane emulsions include those available from DSM NeoResins, Inc. of Wilmington, Mass. as the trade designations "NEOREZ R-960", "NEOREZ R-966", "NEOREZ R-967", "NEOREZ R-9036", and "NEOREZ R-9699"; aqueous non-ionic polyester urethane dispersions available from DSM ReoResins as the trade designation "R-9333" aqueous anionic polyurethane dispersions available from Essential Industries, Inc. of Merton, Wis. as the trade designations "ESSENTIAL CC4520", "ESSENTIAL CC4560", "ESSENTIAL R4100", and "ESSENTIAL R4188"; polyester polyurethane dispersions available from Lubrizol, Inc. of Cleveland, Ohio as the trade designations "SANCURE 843", "SANCURE 898", and "SANCURE 12929"; an aqueous aliphatic self-crosslinking polyurethane dispersion available from DSM Resins as the trade designation "R-2180" and from Lubrizol, Inc. as the trade designation "TURBOSET 2025"; polyurethanes dispersions available from Stahl USA, Peabody, Mass. as the trade designations "RU-077" and "RU-075".

Examples of commercially available aqueous aliphatic acrylic emulsions include acrylic latexes available from Dow Coating Materials as the trade designations ROSHIELD™ and RHOPLEX™, such as "ROSHIELD™ 3188", "ROSHIELD™ 3275", "ROSHIELD™ 1024", "ROSHIELD™ 636", "RHOPLEX™ WL-96", and "RHOPLEX™ CL-104"; acrylic latexes available from Arkema Coating Resins with the trade designation "UCAR™", such as "UCAR™ LATEX 455", "UCAR™ LATEX 443", "UCAR™ LATEX 451", and "UCAR™ LATEX DM109"; acrylic latexes available from Lubrizol Advanced Materials, Inc. as the trade designation HYCAR®, such as "HYCAR® 26349"; "HYCAR® 26459"; and acrylic latexes available from DSM NeoResins as the trade designation "NEOCRYL", such as "NEOCRYL A-612", "NEOCRYL A-640", "NEOCRYL XK-220", "NEOCRYL A-1044", "NEOCRYL XK-90", "NEOCRYL XK-96" and "NEOCRYL XK-95".

In some embodiments, the non-fluorinated polymer of the coating is a thermoplastic aliphatic polyurethane. Thermoplastic polyurethane compositions are generally the reaction product of a diisocyanate with short-chain diols (also referred to as chain extenders) and of diisocyanates with long-chained difunctional diols (known as polyols). Polyurethanes are characterized as having urethane groups, i.e. —NH—(C=O)—O— that link the segments derived from the diisocyanate and diol. Such a urethane group comprise a carbonyl group —C=O.

Non-limiting examples of long-chained polyols are polyether polyols, polyester polyols, acrylic polyols and mixtures of such polyols. Typically, polyester based thermoplastic urethanes are known for providing good abrasion and chemical resistance. The final resin consists of linear polymeric chains in block-structures. Such chains contain low polarity segments, referred to as "soft segments", alternating with shorter, high polarity segments, referred to as "hard segments". Both types of segments are linked together by covalent links, forming random copolymers or block-copolymers.

The term "aliphatic polyurethane" means a polyurethane derived from at least one aliphatic polyisocyanate and at least one aliphatic isocyanate-reactive component, such as an aliphatic diol. Aliphatic polyisocyanates known to the art are: 1,4 cyclohexane bis(methyleneisocyanate); methylcyclohexylene diisocyanate; 1,4-cyclohexanyl diisocyanate; bis(1,4-isocyanato cyclohexyl) methane; 1,6-diisocyanato-2,2,4,4-tetramethylhexane; 1,6-diisocyanato-2,4,4-trimethylhexane; isophorone diisocyanate; and the like. The polyols used for aliphatic polyurethanes may be short chain diols such as neopentyl glycol, 1,6-hexane diol, and the like; as well as polyester or polyether polyols.

The fluoropolymer and non-fluorinated polymer dispersed in the aqueous diluent are film-forming polymers. Suitable polymer latexes and methods for making them are widely known in the art, and many are commercially available. Typically although not necessary, the particles in the fluoropolymer latexes are substantially spherical in shape. The polymer core may comprise one or more water-insoluble polymers, although this is not a requirement. Useful polymer particle sizes include those typical of latexes and other dispersions or emulsions. Typical polymer particle sizes are in a range of from about 0.01 micrometers (10 nm) to 100 micrometers. In some embodiments, the average particle size is at least 20, 30, 40, 50, or 60 nm. In some embodiments, the average particle size of the fluoropolymer and/or non-fluorinated polymer is no greater than 400 or 350 nanometers. In some embodiments, the average particle size of the fluoropolymer and/or non-fluorinated polymer is no greater than 300, 250, 200, 100 or 75 nanometers. Particles in the range from about 1 nm to 100 nm are often termed "nanoparticles" while those from about 200 nm (0.2 micrometers) up to about 2 micrometers are often termed "microparticles". However, many polymer latexes are of sizes intermediate between these ranges, e.g. from about 50 nm to about 500 nm.

The fluoropolymer and non-fluorinated polymer are typically present as discrete particles. Since the fluoropolymer and polymeric binder are not soluble in or swelled by the aqueous liquid medium, both the fluoropolymer and non-fluorinated polymer are generally present in particle form as can be determined by transmission electron microscopy. Hence, the fluoropolymer and non-fluorinated polymer typically do not form a continuous interpenetrating network. The fluoropolymer and non-fluorinated polymer can form a chemical network by reaction of the aziridine groups of a polyaziridine with the carboxylic groups of the fluoropolymer latex and non-fluorinated polymer latex. However, good adhesion, especially to polymeric substrates, such as PET, can be obtained even in the absence of polymeric binder due to the improvement in adhesion provided by the aziridine compound.

Figure 5:
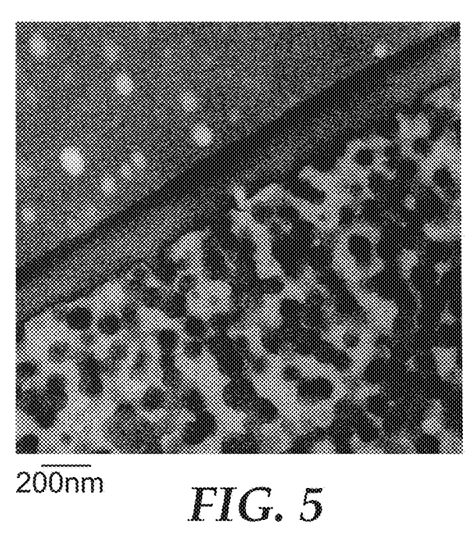
FIG. 5 is a transmission electron microscopy image of the dried coating as described herein.
Figure 6:
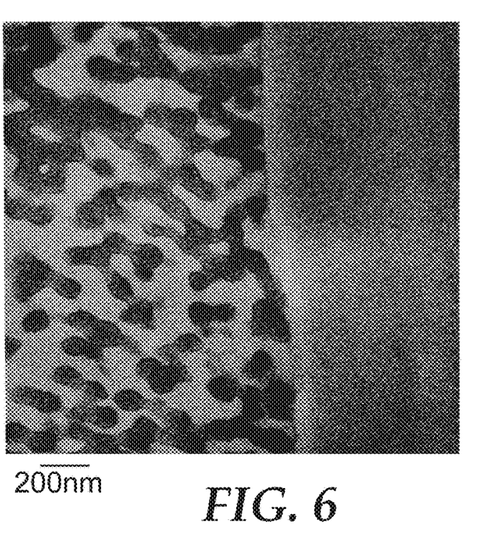
FIG. 6 is a transmission electron microscopy image of the dried coating as described herein that depicts an interface with a substrate.

With reference to FIGS. 5 and 6, the fluoropolymer particles are dark in color; whereas the non-fluorinated polymer particles are much smaller in size and appear light is color adjacent the fluoropolymer particles. In some favored embodiments, the fluoropolymer particles phase separate from the mixture forming a thin outer surface layer (e.g. top THV layer) as depicted in FIG. 5. This phase separation typically occurs during the drying of the coating composition, especially when the drying temperature is above the melt point of the fluoropolymer. The outer surface layer has a greater concentration of fluoropolymer than the underlying mixture of fluoropolymer particles and non-fluorinated polymer particles. The concentration of fluoropolymer in the outer surface layer is typically at least 50, 60, 70, 80, 90, 95 wt.-% of the total organic components of the outer surface layer. When the coating is disposed on a (e.g. polymeric) substrate, the interface of the dried coating adjacent the substrate typically does not comprise a greater concentration of fluoropolymer as depicted in FIG. 5. The outer fluoropolymer layer provides chemical (e.g. solvent) resistance, soil resistance, and weatherability as typically provided by an (e.g. extrusion grade) fluoropolymer film. However, such benefits are provided at a lower cost due to the reduced thickness of the fluoropolymer layer. The interface of the dried coating adjacent the substrate can exhibit better adhesion by the inclusion of the aziridine compound and the non-fluorinated polymer. Additionally, the inclusion of the non-fluorinated polymer can improve/enhance the mechanical properties. The non-fluorinated polymer can also function as a low cost filler that reduces the cost of the coating relative to fluoropolymer coatings lacking the inclusion of non-fluorinated polymer.

The organic portion (i.e. excluding inorganic oxide particles) of the solids of the dried coating composition typically comprises at least 5, 20, 25, 30, 35, 40, 45, or 50 wt-% fluoropolymer (particles) and at least about 50, 55, 60, 65, 70, 75, or 80 wt-% non-fluorinated polymer (particles). Although it is generally preferred to maximize the amount of non-fluorinated polymer while retaining the benefits provided by the fluoropolymer, even small concentration of non-fluorinated polymer can reduce the cost. Thus, in some embodiments, the organic portion (i.e. excluding inorganic oxide particles) of the solids of the dried coating composition can comprise at least 50, 55, 60, 65, 70, 75, 80, 85, 90, or 95 wt-% of fluoropolymer (particles) and at least about 5, 10, 15, 20, 25, 30, 35, 40, or 50 wt-% non-fluorinated polymer (particles).

In some embodiments, the fluoropolymer coating composition comprises one or more aziridine compounds typically present in a total amount of at least 0.1, 0.2, 0.3, 0.4, or 0.5 wt-% up to 1, 2 or 3 wt-% solids of the coating composition. The dried fluoropolymer coating comprises a reaction product of such aziridine compound(s). Such reaction product generally comprises a ring-opened aziridine linkage, otherwise known as an amide linkage, characterized by the presence of a —NH unit. At such low concentrations, any crosslinking that does occur between functional groups of the fluoropolymer and the aziridine compound typically does not result in an appreciable improvement in mechanical properties. However, such low concentrations can provide a substantial improvement in adhesion, especially to polymeric substrates, such as PET. In other embodiments, a higher concentration of aziridine compound is utilized. For example, the concentration of aziridine compound or reaction product thereof can range up to 5, 10, 15, 20, 25 or 30 wt-% of the solids of the coating composition. Higher concentrations are typically utilized for embodiments wherein higher concentrations of inorganic nanoparticles are utilized and an aziridine compound is utilized that can react with the inorganic nanoparticles. For example, the alkoxy silane groups of an aziridine alkoxy silane compound can react with hydroxyl groups present on the inorganic nanoparticles; while the aziridine group can improve adhesion with the substrate. In some embodiments, a combination of at least one aziridine compound that comprises at least two aziridine groups and at least one aziridine alkoxy silane compound is utilized at a weight ration of 1:4 to 4:1 or 1:3 to 3:1 or 1:2 to 2:1 or about 1:1.

In some embodiments, the aziridine compound comprises at least two aziridine groups. The aziridine compound may comprise 3, 4, 5, 6, or greater than 6 aziridine groups. The aziridine compound may be represented by the following structure:

wherein R is a core moiety having a valency of Y;

L is a bond, divalent atom, or divalent linking group;

$R_1$, $R_2$, $R_3$, and $R_4$ are independently hydrogen or a $C_1$-$C_4$ alkyl (e.g. methyl); and Y is typically 2, 3, or greater.

In some embodiments, R is —$SO_2$—. In some embodiments, R-L is a residue of a multi(meth)acrylate compound. In some embodiments L is a $C_1$-$C_4$ alkylene, optionally substituted with one or more (e.g. contiguous or pendant) oxygen atoms thereby forming ether or ester linkages. In typical embodiments, $R_1$ is methyl and $R_2$, $R_3$, and $R_4$ are hydrogen.

Representative aziridine compounds include trimethylolpropane tri-[beta-(N-aziridinyl)-propionate, 2,2-bishydroxymethyl butanoltris[3-(1-aziridine) propionate]; 1-(aziridin-2-yl)-2-oxabut-3-ene; and 4-(aziridin-2-yl)-but-1-ene; and 5-(aziridin-2-yl)-pent-1-ene.

In some embodiments, a polyaziridine compound can be prepared by reacting divinyl sulfone with alkylene (e.g. ethylene) imine, such as described in U.S. Pat. No. 3,235,544. On representative compound is di(2-propyleniminoethyl)sulfone, as depicted as follows:

Polyaziridine compounds can be prepared via a Michael addition of a multi(meth)acrylate compound with an (e.g. $C_1$-$C_4$ alkyl) aziridine, such as 2-methyl aziridine (also known as 2-methyl ethylenimine). Suitable multi(meth) acrylate compounds comprise at least two and is some embodiments at least 3, 4, 5, or 6 (meth)acrylate functional groups. Representative multi(meth)acrylate compounds typically comprise at least two (meth)acrylate groups including for example hexanediol acrylate (HDDA), pentaerythritol tri(meth)acrylate, pentaerythritol tetra(meth)acrylate, trimethylolpropane tri(methacrylate), dipentaerythritol penta(meth)acrylate, dipentaerythritol hexa(meth)acrylate ("SR444"), trimethylolpropane ethoxylate tri(meth)acrylate, glyceryl tri(meth)acrylate, pentaerythritol propoxylate tri (meth)acrylate, and di(trimethylolpropane) tetra(meth)acrylate. In such reactions each (meth)acrylate group provides a site for addition of the aziridine group and the remaining multi(meth)acrylate starting compound. Thus, R-L is a residue (i.e. recognizable part) of the multi(meth)acrylate compound. Some representative polyaziridine compounds that can be prepared via a Michael addition are as follows:

In some embodiments, the polyaziridine compound lacks hydrolyzable (e.g. linking) groups, such as linking groups comprising an ester group. One representative compound, in which the synthesis is described in the forthcoming examples, is as follows:

In some embodiments the polyaziridine compound may comprise alkylene oxide repeat units, such as ethylene oxide repeat units. The number of alkylene oxide (e.g. ethylene oxide) repeats units is typically at least 2 or 3 and typically no greater than about 20. In some embodiments, the number of alkylene oxide (e.g. ethylene oxide) repeat units averages about 6, 7, 8, or 9. One representative of this type is as follows.

wherein R' is hydrogen or a $C_1$-$C_4$ alkyl;
R'' is hydrogen or a $C_1$-$C_4$ alkyl (e.g. methyl);
x, y, and z are independently at least 1; and
M is a bond, divalent atom, or divalent linking group.

In some embodiments, the sum of x+y+z is at least 3, 4, 5, or 6. Further the sum of x+y+z is typically no greater than 20. In some embodiments, M is a covalent bond or a $C_1$-$C_4$ alkylene.

Other polyaziridine compounds comprising alkylene oxide repeat units are described in U.S. Pat. No. 8,017,666; incorporated herein by reference.

The above described polyaziridine compounds comprise at least two aziridine groups at the time the compound is added to the coating composition. In other embodiments, the polyaziridine compound does not comprise two aziridine groups at the time the compound is added to the coating composition, yet forms a polyaziridine in-situ. For example, compounds comprising a single aziridine group and a single (meth)acrylate group can form a dimer or oligomerize by reaction of the (meth)acrylate groups thereby forming a polyaziridine (i.e. diaziridine) compound.

In other embodiments, the aziridine compound is an aziridine alkoxy silane compound, also referred to as aziridinyl siloxanes. Such compounds are known for examples from U.S. Pat. No. 3,243,429; incorporated herein by reference. Aziridine alkoxy silane compounds may have the general structure:

wherein R'' is hydrogen or a $C_1$-$C_4$ alkyl (e.g. methyl);
X is a bond, a divalent atom, or a divalent linking group;
n is 0, 1 or 2;
m is 1, 2, or 3; and
and the sum or n+m is 3.

One representative compound is 3-(2-methylaziridinyl) ethylcarboxylpropyltriethoxysilane.

In some embodiments, the coating composition is free of inorganic nanoparticles. In other embodiments, the coating composition comprises inorganic nanoparticles.

The inorganic oxide particles are nanoparticles, typically having an average primary or agglomerate particle size diameter of at least 1, 2, 3, 4, or 5 nanometers and typically no greater than 80, 90, 100, or 200 nanometers. The average particle size of the nanoparticles of the cured coating can be measured using transmission electron microscopy. The average particle size of the nanoparticles of the coating solution can be measured using dynamic light scattering. "Agglomerate" refers to a weak association between primary particles which may be held together by charge or polarity and can be physically broken down into smaller entities. "Primary particle size" refers to the mean diameter of a single (non-aggregate, non-agglomerate) particle. Unlike fumed silica that comprises silica aggregates, in favored embodiments the nanoparticles utilized herein comprise a substantial concentration of discrete unaggregated nanoparticles. As used herein "aggregate" with respect to particles refers to strongly bonded or fused particles where the resulting external surface area may be significantly smaller than the sum of calculated surface areas of the individual components. The forces holding an aggregate together are strong forces, for example covalent bonds, or those resulting from sintering or complex physical entanglement. Although agglomerated nanoparticles can be broken down into smaller entities such as discrete primary particles such as by application of a surface treatment; the application of a surface treatment to an aggregate simply results in a surface treated aggregate. In some embodiments, a majority of the nanoparticles (i.e. at least 50%) are present as discrete unagglomerated nanoparticles. For example, at least 70%, 80% or 90% of the nanoparticles are present as discrete unagglomerated nanoparticles.

Preferably, the nanoparticles comprise silica. Nanoparticles can include essentially only silica (although other oxides can be used, such as $ZrO_2$, colloidal zirconia, $Al_2O_3$, colloidal alumina, $CeO_2$, colloidal ceria, $SnO_2$, colloidal tin (stannic) oxide, $TiO_2$, colloidal titanium dioxide), or they can be composite nanoparticles such as core-shell nanoparticles. A core-shell nanoparticle can include a core of an oxide (e.g., iron oxide) or metal (e.g., gold or silver) of one type and a shell of silica deposited on the core. Herein, "silica nanoparticles" refer to nanoparticles that include only silica as well as core-shell nanoparticles with a surface that includes silica.

The coatability of the aqueous coating composition can be improved by inclusion of a small concentration of inorganic nanoparticles such as silica or clay that functions, at least in part, as a thickener. In this embodiment, the coating composition may contain 1, 2, 3, 4, or 5 wt-% of inorganic oxide nanoparticles. In order to improve mechanical properties, such as abrasion resistance and pencil hardness, the concentration of (e.g. silica) inorganic nanoparticles is typically at least 5, 6, 7, 8, 9, or 10 wt-% solids of the dried coating composition. In some embodiments, the dried coating compositions comprises at least 11, 12, 13, 14 or 15 wt-% of (e.g. silica) inorganic nanoparticles. In some embodiments, the dried coating compositions comprises no greater than 60, 55, 50, 45 or 40 wt-% of (e.g. silica) inorganic nanoparticles.

The nanoparticles are typically relatively uniform in size. The variability in the size of the nanoparticles is typically less than 25 percent of the mean particle size. In some embodiments the (e.g. silica) nanoparticles have a relatively small average particle size. For example, the average primary or agglomerate particle size may be less than 75 nm, 50 nm, or 25 nm and in some embodiments, less than 20 nm, 15 or 10 nm. When such smaller nanoparticles are employed, it is typically preferred that such nanoparticles are surface modified with a hydrophilic surface treatment such as 3-glycidoxylpropyl trimethoxy silane.

Alternatively, the nanoparticles can be surface modified with other hydrophilic organosilane surface treatment (e.g. lacking a longer chain alkyl group having 4 or more carbon atoms) that typically comprise other hydrophilic groups such as alkylene oxide groups, acids and salts, as well as hydroxyl groups. Suitable hydrophilic surface treatments include poly (ethyleneoxide)/poly(propyleneoxide) trialkoxysilane, sulfonato-organosilanols, also called organosilanol-sulfonic acids/salts having chemical structures such as described in U.S. Pat. Nos. 4,338,377 and 4,152,165. Representative surface treatments include $NaOSi(OH)_2(CH_2)_3SO_3Na$, $(OH)_3Si(CH_2)_3OCH_2CH(OH)CH_2SO_3H$, 3-hydroxylpropyl trimethoxysilane, $(HO)_3SiCH_2CH_2COOH$ and its carboxylate silane. Since the coating compositions are not subjected to photocrosslinking, the (e.g. silica) nanoparticles typically do not comprise a surface treatment having a vinyl or (meth)acrylate moiety.

In the absence of surface modification of such relatively small nanoparticles, the coating can exhibit short solution shelf-life time. However, when the (e.g. silica) inorganic oxide nanoparticles have an average particle size of greater than 20 nm, the nanoparticles do not require surface modification to provide useful solution stability. Thus the nanoparticles are "unmodified nanoparticles" since the nanoparticles do not comprise a surface treatment. It is appreciated however, that unmodified silica nanoparticles commonly comprise hydroxyl or silanol functional groups on the nanoparticle surface, particularly when the nanoparticles are provided in the form of an aqueous dispersion. Further, the larger nanoparticles can optionally be surface modified with the hydrophilic surface treatments previously described.

Inorganic silica sols in aqueous media are well known in the art and available commercially. Silica sols in water or water-alcohol solutions are available commercially under the trade designations LUDOX (manufactured by E.I. duPont de Nemours and Co., Inc., Wilmington, Del.), NYACOL (available from Nyacol Co., Ashland, Mass.) or NALCO (manufactured by Nalco Chemical Co., Oak Brook, Ill.). Some useful silica sols are NALCO 1115, 2326, 1050, 2327, and 2329 available as silica sols with mean particle sizes of 4 nanometers (nm) to 77 nm. Another useful silica sol is NALCO 1034a available as a silica sol with mean particle size of 20 nanometers. Another useful silica sol is NALCO 2326 available as a silica sol with mean particle size of 5 nanometers. Additional examples of suitable colloidal silicas are described in U.S. Pat. No. 5,126,394. Siliceous nanoparticles (that include silica nanoparticles) are also available from Southern Clay Product Inc., Gonzales, Tex.

In some embodiments, the silica nanoparticles used in coating compositions are acicular. The term "acicular" refers to the general, elongated shape of the particles and may include other string-like, rod-like, chain-like shapes, as well as filamentary shapes. The acicular colloidal silica particles may have a uniform thickness of 5 to 25 nm, a length, Di, of 40 to 500 nm (as measured by dynamic light-scattering method) and a degree of elongation D1/D2 of 5 to 30, wherein $D_2$ means a diameter in nm calculated by the equation $D_2=2720/S$ and S means specific surface area in $m^2/g$ of the particle, as is disclosed in the specification of U.S. Pat. No. 5,221,497.

U.S. Pat. No. 5,221,497 discloses a method for producing acicular silica nanoparticles by adding water-soluble calcium salt, magnesium salt or mixtures thereof to an aqueous colloidal solution of active silicic acid or acidic silica sol having a mean particle diameter of 3 to 30 nm in an amount of 0.15 to 1.00 weight percent based on CaO, MgO or both to silica, then adding an alkali metal hydroxide so that the molar ratio of $SiO_2/M_2O$ (M:alkali metal atom) becomes 20 to 300, and heating the obtained liquid at 60 to 300 degrees centigrade for 0.5 to 40 hours. The colloidal silica particles obtained by this method are elongate-shaped silica particles that have elongations of a uniform thickness within the range of 5 to 40 nm extending in only one plane. Acicular silica sol may also be prepared as described in U.S. Pat. No. 5,597,512.

Useful acicular silica particles may be obtained as an aqueous suspension the trade name SNOWTEX-UP by Nissan Chemical Industries (Tokyo, Japan). The mixture consists of 20-21 percent (w/w) of acicular silica, less than 0.35 percent (w/w) of $Na_2O$, and water. The particles are 9 to 15 nanometers in diameter and have lengths of 40 to 300 nanometers. The suspension has a viscosity of less than 100 mPas at 25 Degrees centigrade a pH of 9 to 10.5, and a specific gravity of 1.13 at 20 degrees centigrade.

The silica sols used in the present disclosure generally can include counter cations, in order to balance the surface charge of the colloids. Examples of cations suitable for use as counter ions for negatively charged colloids include $Na^+$, $K^+$, $Li^+$, a quaternary ammonium cation such as $NR_4^+$, wherein each R can be any monovalent moiety, but is preferably H or lower alkyl, such as —$CH_3$, combinations of these, and the like.

The method of making the coating entails providing an aqueous dispersion comprising at least one fluoropolymer comprising fluoropolymer (latex) particles and at least one non-fluorinated polymer comprising non-fluorinated (latex) polymer particles. This is typically accomplished by combining an aqueous fluoropolymer latex dispersion and an aqueous non-fluorinated polymer latex dispersion (comprising non-fluorinated polymer particles). When the dispersion is neutral or acidic, the method further comprises adjusting the pH of the mixture to be sufficiently basic, such as by addition of ammonia. The aqueous liquid medium preferably is basic, having a pH of at least 8 and typically no greater than 10, 10.5, 11, 11.5 or 12. The method further comprises adding at least one aziridine compound to the basic aqueous liquid medium. When the coating further comprises inorganic oxide nanoparticles, the inorganic oxide nanoparticles are typically also provided as an aqueous dispersion and may be added prior to adjusting the pH and prior to adding the aziridine compound.

Although the coating composition comprises water as the primary liquid component, in some embodiments, the coating composition may optionally comprise a small amount of an organic cosolvent. For example, organic cosolvents may be present in the commercially available aqueous dispersions of the fluoropolymer latex and/or inorganic oxide nanoparticles. The concentration of the organic cosolvent is typically no greater than 15 wt-% of the total liquids of the coating composition. In some embodiments, the organic cosolvent is no greater than 10 or 5 wt-% of the total liquids of the coating composition.

The coating composition may optionally comprise various additives as known in the art including for example thickeners (such as clay available from Southern Clay Product Inc., Gonzales, Tex., as the trade designation "LAPRD"), surfactants, pigments including $TiO_2$ or carbon black, fillers, as well as one or more light stabilizers. Light stabilizer additives include ultraviolet absorbing compounds such as hydroxybenzophenones and hydroxybenzotriazoles. Other light stabilizer additives include hindered amine light stabilizers (HALS) and antioxidants. Thermal stabilizers can also be used if desired.

When the coating lacks an inorganic nanoparticle thickener, the coating typically comprises a surfactant. Various surfactant suitable for fluoropolymer coatings are known, such as described in previously cited US2011/0034604. In one embodiment, the coating comprises an ionic surfactant such as a sodium alpha olefin sulfonates, commercially available from Stepan Company under the trade designation "A-18".

In one embodiment, the fluoropolymer coating composition includes barrier particles, such as described in U.S. Pat. No. 8,025,928. Such particles are platelet-shaped particles. Such particles tend to align during application of the coating and, since water, solvent and gases such as oxygen cannot pass readily through the particles themselves, a mechanical barrier is formed in the resulting coating which reduces permeation of water, solvent and gases. In a photovoltaic module, for example, the barrier particles substantially increase the moisture barrier properties of the fluoropolymer and enhance the protection provided to the solar cells. Barrier particles can be in amount from about 0.5 to about 10% by weight based on the total dry weight of the fluoropolymer composition in the coating.

Examples of typical platelet shaped filler particles include clay, mica, glass flake and stainless steel flake, and aluminum flake. In one embodiment, the platelet shaped particles are mica particles, including mica particles coated with an oxide layer such as iron or titanium oxide. In some embodiments, these particles have an average particle size of about 10 to 200 microns in more specific embodiments 20 to 100 microns with no more than 50% of the particles of flake having average particle size of more than about 300 microns.

The fluoropolymer coating described herein can be used to prepare a coated substrate wherein a surface of the substrate comprises the dried coating composition. In some embodiments, the substrate may be an inorganic substrate, such as glass, or polymeric substrate. In other embodiments, the substrate is a polymeric substrate. Polymeric substrates can be made of polyester (e.g., polyethylene terephthalate (PET), polybutylene terephthalate), polycarbonate (PC), allyldiglycolcarbonate, polyacrylates such as polymethylmethacrylate, polystyrene, polysulfone, polyethersulfone, cellulose acetate butyrate, polyolefin, PVC, polyamide, polyurethane, polyimide, polyurea, and the like, including blends and laminates thereof.

In some embodiments, the substrate is a planar substrate such as a panel or film substrate. The thickness of the substrate can vary, but typically ranges from about 2 mils to about 30 mils.

In some embodiments, the substrate is light transmissive, having light transmission between at least 300 nm to 1200 nm.

The surface of the (e.g. polymeric) substrate which is to be coated may be surface treated to improve adhesion such as by electrical discharge such as corona treatment or by atmospheric nitrogen plasma treatment. However, the coating composition described herein has been found to exhibit good adhesion to (e.g. polyester) polymeric substrates, and other fluoropolymers in the absence of such surface treatment.

The aqueous fluoropolymer coating compositions for making the fluoropolymer coated film can be applied as a liquid directly to suitable (e.g. polymeric) substrate films by conventional coating means such as spray, roll, knife, curtain, gravure coaters, or any other method that permits the application of a relatively uniform coating. In some embodiments, the primer coating thickness of the dried coating is between about 2.5 microns (0.1 mil) and about 25 microns (1 mil). In some embodiments, the dried coating has a thickness no greater than 20 microns, or 15 microns, or 10 microns. In some embodiments, the coating thickness of an exposed outer surface layer (e.g. backside of photovoltaic module) is the same thickness of the primer. In other embodiments, the coating thickness ranges up to 250 microns (10 mils). A single coating or multiple coatings can be applied to obtain the desired thickness.

After application, the water (and optional cosolvent) is removed, and the fluoropolymer coating is adhered to the (e.g. polymeric) substrate (e.g. film). In some embodiments the coating compositions can be coated onto the substrate and allowed to air dry at ambient temperatures. Although not necessary to produce a coalesced film, heating is generally desirable for crosslinking and to dry the coating more quickly. The coated substrate can be subjected to a single heating step or by multiple heating steps. The drying temperature can range from room temperature to oven temperatures in excess of that required for the coalescence of fluoropolymers. Thus, the drying temperature can be in the range of about 25° C. to about 200° C. The drying temperature can increase as the concentration of TFE increases. In some embodiments, the drying temperature is least about 125° C., 130° C., 135° C., 140° C., 145° C., or 160° C. Typically, the drying temperature is selected based on the melting temperature of a selected fluoropolymer resin.

Figure 1:
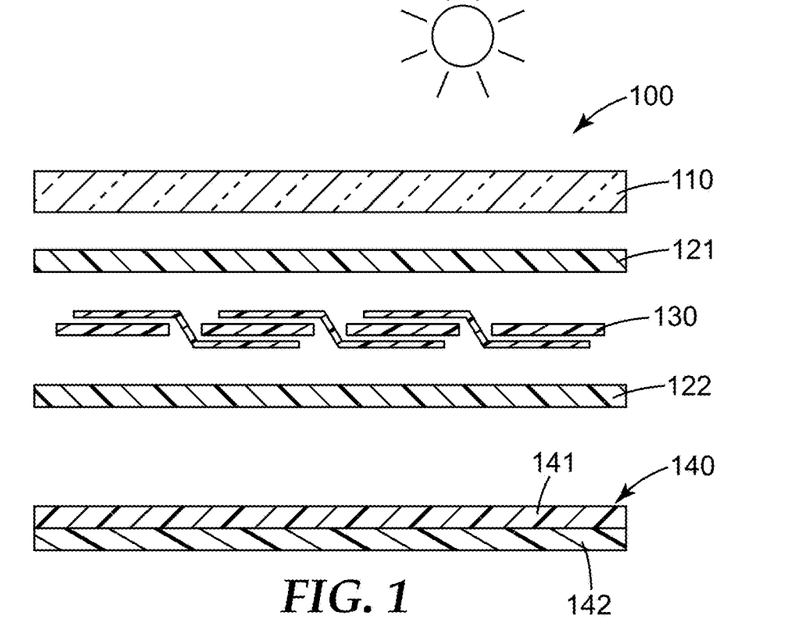
FIG. 1 is a schematic cross-section of a photovoltaic cell.

In some embodiments, fluoropolymer coated films are useful in photovoltaic modules that convert solar energy to electrical energy. With reference to FIG. 1, a typical construction for a photovoltaic module 100 includes a thick layer of glass 110 as a glazing material. The glass protects solar cells comprising crystalline silicon wafers and wires 130 that are embedded in a moisture resisting plastic sealing (e.g. encapsulant) compound 121, and 122 such as cross-linked ethylene vinyl acetate. Typically 130 includes two wafers of doped silicon (p-type and n-type) in contact to form a junction with each wafer having an electrical connection. As an alternative to crystalline silicon wafers and wires, thin film solar cells can be applied from various semiconductor materials, such as CIGS (copper-indium-gallium-selenide), CTS (cadmium-tellurium-sulfide), a-Si (amorphous silicon) and others on a carrier sheet which is also jacketed on both sides with encapsulant materials (121, 122). The encapsulant 122 is bonded to a backsheet 140. Fluoropolymer coated films 140 are useful for such backsheet. In one embodiment, the polymeric substrate film is a polyester 141, and in a more specific embodiment, a polyester selected from the group consisting of polyethylene terephthalate, polyethylene naphthalate and a coextrudate of polyethylene terephthalate/polyethylene naphthalate. In one embodiment the polymeric substrate is a heat sealable film such as 3M™ Scotchpak™ Heat Sealable Polyester Film that comprises PET combined with olefinic polymers such as ethylene vinyl acetate (EVA). Polyester provides electrical insulation and moisture barrier properties, and is an economical component of the backsheet. The dried fluoropolymer coating described herein forms the outer layer 142 that is typically exposed to the environment. In another embodiment, (not shown) both surfaces of the polymeric substrate film 141 are coated with fluoropolymer creating a sandwich of polyester between two layers of coating of fluoropolymer. In some embodiments, the fluoropolymer layer may be bonded directly to the (e.g. EVA) encapsulant. Fluoropolymer films provide excellent strength, weather resistance, UV resistance, and moisture barrier properties to the backsheet.

Figure 2:
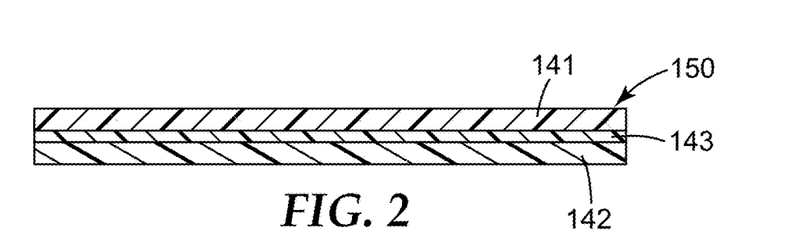
FIG. 2 is a schematic cross-section of another embodiment of a backsheet of a photovoltaic cell.

With reference to FIG. 2, in one embodiment, the fluoropolymer film comprises primer layer 143, formed from a dried fluoropolymer coating composition as described herein, present between the polymeric substrate film 141 and the dried fluoropolymer coating 142 surface layer. In this embodiment, both the primer layer and the outer layer 142 can be formed from an aqueous fluoropolymer coating as described herein. Alternatively, the outer layer 142 can be formed from a thermoplastic fluoropolymer that is extruded molten onto the primer layer or heat laminated to the primer layer. In this embodiment, the fluoropolymer layer disposed on the primer lacks fluoropolymer particles. In both embodiments, the outer layer 142 typically has a higher concentration of inorganic nanoparticles as compared to the primer layer 143.

Figure 3:
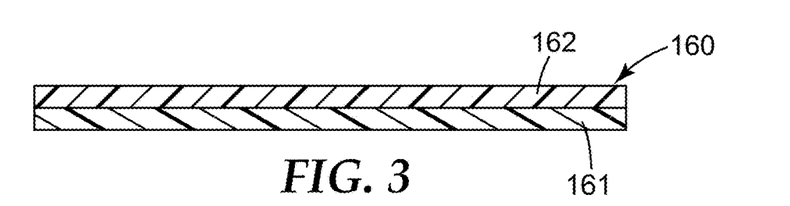
FIG. 3 is a schematic cross-section of a substrate comprising a coating as described herein.
Figure 4:
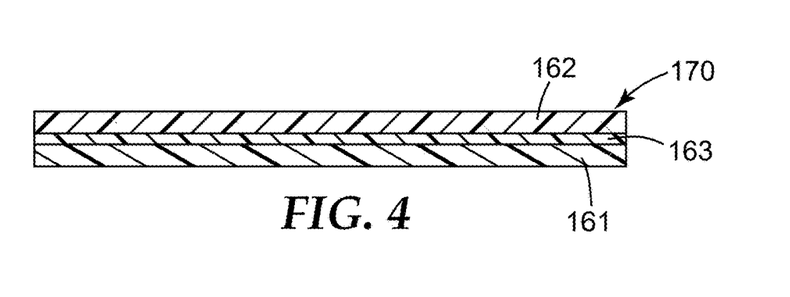
FIG. 4 is a schematic cross-section of a substrate comprising a primer and coating as described herein.

A (e.g. polymeric) film having a coating, as described herein, is surmised to have other uses. With reference to FIGS. 3-4, in another embodiment, the article comprises a substrate, such as a polymeric film, comprising the dried aqueous fluoropolymer coating 162. With reference to FIG. 4, primer layer 163, formed from the dried fluoropolymer coating composition as described herein, may be present between the polymeric substrate film 171 and a fluoropolymer film layer. In some embodiments, the fluoropolymer film layer comprises a dried fluoropolymer coating 172, as described herein.

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

EXAMPLES

Materials

Unless otherwise noted, all parts, percentages, ratios, etc., in the examples and in the remainder of the specification are by weight. Unless otherwise noted, all chemicals were obtained or are available from, chemical suppliers such as Aldrich Chemical Company, Milwaukee, Wis.

"2 nm $SiO_2$" was silica nanoparticle dispersion, particle size 2 nm, obtained from Nalco Company, Naperville, Ill., under trade designation "NALCO 8699".

"5 nm $SiO_2$" was silica nanoparticle dispersion, particle size 5 nm, obtained from Nalco Company, Naperville, Ill., under trade designation "NALCO 2326".

"THV340Z" was a (50 wt.-% solids) dispersion of a polymer of tetrafluoroethylene, hexafluoropropylene and vinylidene fluoride obtained from 3M Company, St. Paul, Minn. as the trade designation "3M™ DYNEON™ FLUOROPLASTIC THV 340Z", reported to have an average particle size of 120 nm, a pH of 9.5, and a melting point of 145° C.

"FP2" was a dispersion (50 wt. %) of a fluoropolymer that can be prepared in a similar manner as Example 1 of U.S. Pat. No. 6,943,228 utilizing the following amounts of monomers: 48 mol % of tetrafluoroethylene, 20 mole % hexafluoropropylene and 22 mol % vinylidene fluoride. The fluoropolymer has a melting point of 165° C. and the melt flow index (265° C./5 kg) is 9 g/10 min.

"FP3" was a dispersion (50 wt. %) of a fluoropolymer that can be prepared in a similar manner as Example 1 of U.S. Pat. No. 6,943,228 utilizing the following amounts of monomers: 62 mol % of tetrafluoroethylene, 18 mole % hexafluoropropylene and 20 mol % vinylidene fluoride. The fluoropolymer has a melting point of 190° C. and the melt flow index (265° C./5 kg) is 9 g/10 min.

"FP4" was a dispersion (50 wt. %) of a fluoroelastomer having a Tg of −10° C. that can be prepared in a similar manner as Example 1 of U.S. Pat. No. 6,943,228 utilizing the following amounts of monomers: 24.2 mol % of tetrafluoroethylene, 22.4 mole % hexafluoropropylene, 53.4 mol % vinylidene fluoride; and 0.16 wt-% bromine and 0.14 wt-% iodine by inclusion of a cure site monomer and chain transfer agent in the polymerization as described in US2011/0034604.

"Lumiflon ZBF500-1" is a water-based fluoropolymer (fluoroethylene vinyl ether copolymer obtained from Dalian Zhenbang Co. (Dalian, China).

Arkema PVDF—a fluoropolymer latex available from Arkema as the trade designation "Kynar Aquatec® ARC latex".

R960 is an aliphatic polyurethane dispersion available from DSM NeoResins as the trade designation NeoRez™ R-966.

R966 is an aliphatic polyurethane dispersion available from DSM NeoResins as the trade designation NeoRez™ R-966.

R2180 is a self-crosslinking aliphatic polyurethane dispersion available from DSM NeoResins as the trade designation NeoRez™ R-2180.

R9330 is a non-ionic polyester urethane dispersion available from DSM NeoResins as the trade designation NeoRez™ R-9330.

A-612 is an acrylic emulsion available from DSM Neo-Resins as the trade designation NeoCryl™ A-612.

3-glycidoxypropyltrimethoxysilane was obtained from Alfa-Aesar, Ward Hill, Mass.

CX-100 is a polyfunctional aziridine liquid reported to have an equivalent weight of 156 obtained from Royal DSM N.V., Harleen, Netherlands under trade designation "CX-100".

Rhoplex acrylic dispersion from Dow.

PZ-28 is a trimethyolpropane tris(methyl-1-aziridine propionate available from PolyAziridine LLC, Medford, N.J.

2-methyl aziridine obtained from Sigma Aldrich Company, St. Louise, Minn.

1,3,5-triacryloyl hexahydro-s-triazine can be obtained from Sigma Aldrich Company.

Diaziridine was di(2-propyleniminoethyl)sulfone as described in U.S. Pat. No. 3,235,544.

PZ-2382 was prepared by Michael addition of ethoxylated (9) trimethylpropane triacrylate, obtained from Eternal Chemical Co., as described in Preparative Example 4 of WO2013/089926.

Preparation of Tris(aziridino) triazine

A 100 mL RB flack fitted with a condenser was dried by flushing with nitrogen. Into the flask was placed 1,3,5-triacryloyl hexahydro-s-triazine (98%, 25.4 g, 0.10 mole). To the solid was added 2-methylaziridine (90%, 20.4 g, 0.32 mole) by dropwise at room temperature while the reactant mixture was stirred. The reaction was exothermic and all the triazine was dissolved. After addition, the solution was stirred and heated at 60 deg. C. overnight. The solution was allowed to cool and the reaction solution was subjected to rotavap to remove the excess 2-methylaziridine. A clear and viscous liquid was obtained in a 100% conversion. HNMR was performed in CDCL3 and the resulting HNMR spectrum indicated the complete disappearance of the starting vinyl protons.

Cross Hatch Adhesion Test

The coated samples about 5 cm×5 cm in size on 50 micrometer-thick PET substrates prepared as described below were cut (cross hatched) on their coated side to form about 16 squares using a sharp razor blade. The cut samples were immersed in water at 50° C. overnight. Then the coated samples were removed from water, wiped and an adhesive tape with an aluminum backing available from 3M under the trade designation "(3M-425-DWB)" was stuck on their coated side. The number of squares removed from the coated side of PET substrate with the adhesive tape was recorded to indicate the adhesion quality of the coatings to the PET substrate.

Adhesion to THV610 Film

The described fluoropolymer coated samples were heat laminated to fluoropolymer films comprised of THV 610 having a thickness of 1 mil. The resulting laminated samples were then placed between two PTFE sheets and pressed for 1 minute at 160° C. with pressure (50-100 pounds per inch on average) applied between two heated platens of a Wabash Hydraulic press and then the laminates and immediately transferred to a cold press. After cooling to room temperature by a "cold press", the laminates were subjected to water immersion at 50° C. overnight unless indicated otherwise. The strength of adhesion of the coatings described herein to the THV 610 fluoropolymer coating was evaluated using the cross hatch adhesion test. The adhesion peel force was recorded as good, fair, or poor according to the following criteria:

2.4 lbf/inch=good
1.5 lbf/inch=fair
<0.5 lbf/inch=poor

Pencil Hardness

The surfaces of the coated samples were scratched with an ASTM standard pencil of varying hardness (i.e., 2H, 3H, and so on). The tracks of pencil scratch on the coatings were then examined by a microscope. If the PET was not scratched but was compressed to form the pencil grooves, and the coating is undamaged the test was repeated with another pencil with higher hardness. The highest pencil hardness that the coatings could handle without damage was determined and reported.

Fluoropolymer Coating Preparation:

The described fluoropolymer latex dispersions were diluted to 25 wt-% solids or 30 wt-% solids with deionized water unless indicated otherwise. When present, (unmodified or modified) silica nanoparticles were added to the fluoropolymer latex dispersion at the weight ratio of solids described in the tables. Concentrated aqueous ammonium hydroxide was added to adjust the pH value of the mixed dispersion to 9.5-10.0. Subsequently, the described aziridine compounds were added at the amount indicated. The mixed dispersions were coated on IPA wiped PET with a #12 Meyer bar unless indicated otherwise. The coated films were heated at 150-160° C. for 5 minutes unless indicated otherwise.

Examples 1-4 each contained 60 wt-% solids of THV340Z, 35 wt-% of the indicated non-fluorinated polymer, and 5 wt-% of CX-100.

| Examples | Composition | Adhesion to THV610 Film | Cross Hatch Adhesion |
|---|---|---|---|
| 1 | THV 340Z/R960/CX-100 (60/35/5) | Good | Good |
| 2 | THV 340Z/R966/CX-100 (60/35/5) | Good | Good |
| 3 | THV 340Z/R2180/CX-100 (60/35/5) | Good | Good |
| 4 | THV 340Z/R9330/CX-100 (60/35/5) | Good/fair | Good |

Examples 7-11 each contained 95 wt-% solids of a blend of THV340Z and R966 at the weight ratio indicated in parenthesis and 5 wt-% of CX-100.

| Examples | Composition (THV 340Z:R966)/CX-100 | Adhesion to THV610 Film |
|---|---|---|
| 7 | (100:0) 95/5 | Good |
| 8 | (90:10) 95/5 | Good |
| 9 | (80:20) 95/5 | Good |
| 10 | (60:40) 95/5 | Good |
| 11 | (50:50) 95/5 | Good |
| 12 | (40:60) 95/5 | Fair |
| 13 | (30:70) 95/5 | Fair |
| 14 | (0:100) 95/5 | Poor |

The same results as Examples 7-11 were obtained with the 80:20 and 70:30 blend using CX-100 concentrations of 1.5 and 3.0 wt-%.

The same result as Example 10 was obtained with different thicknesses of the coating obtained by use of different dilutions, specifically 24.6 wt.-%, 32.3 wt.-%, 38.4 wt.-% and 42.8 wt.-% solids coatings were utilized.

Examples 15-23 each contained a blend of THV340Z and R966 at the weight ratio indicated in parenthesis and the polyaziridine indicated in the third column at the concentration indicated (e.g. Example 15 contained 95 wt-% solids of a 60:40 blend and 5 wt-% solids of polyaziridine. The 60:40 blend contained 60 wt-% solids of THV340Z fluoropolymer and 40 wt-% solids of R966 polyurethane.)

| Example | Composition (THV 340Z: R966)/ Polyaziridine | Polyaziridine | Adhesion to THV610 Film |
|---|---|---|---|
| 15 | (60:40) 95/5 | CX-100 | Good |
| 16 | (70:30) 95/5 | PZ-28 | Good |
| 17 | (70:30) 95/5 | PZ-2382 | Good |
| 18 | (67:33) 98/2 | aziridine alkoxysilane | Good |
| 19 | (67:33) 96/4 | aziridine alkoxysilane | Good |
| 20 | (67:33) 94/6 | aziridine alkoxysilane | Good |
| 21 | (67:33) 98/2 | Diazirdine | Good |
| 22 | (67:33) 96/4 | Diazirdine | Good |
| 23 | (67:33) 94/6 | Diazirdine | Good |

| Example | Composition (Arkema PVDF/R966)/PZ-28 | Adhesion to PVDF Film (6 days) |
|---|---|---|
| 24 | (100:0) 95/5 | Good |
| 25 | (70:30) 95/5 | Good |
| 26 | (70:30) 97/3 | Fair |
| 27 | (70:30) 92.5/7.5 | Good |
| (Control) | (70:30) 100/0 | — |

The same result was obtained with Example 25 when tested with oven times of 1, 2 and 3 minutes (rather than 5 minutes).

| Sample | Composition (Lumiflon ZB-F500-1:R966)/PZ-28 | Cross Hatch Adhesion | Film appearance |
|---|---|---|---|
| Control A | (100:0) | Delamination | Hazy |
| Control B | (100:0) 95/5 | Good | Clear |
| Control C | (67:33) 100 | Delamination | Slight haze |
| 28 | (67:33) 95/5 | Good | Clear |

The improvement in adhesion contributed by the aziridine compound is evident by comparing Control B to Control A and C that lack an aziridine compound.

| Example | Composition: THV 340/A612/PZ-38 (60/35/5) | Adhesion to THV610 Film (3 days) |
|---|---|---|
| 29 | THV 340/A612/PZ-38 (62/35/3) | good |
| 30 | THV 340/A612/PZ-38 (60/35/5) | good |
| 31 | THV 340/A612/PZ-38 (53/35/7) | good |
| 32 | THV 340/Rhoplex/PZ-38 (60/35/5) | good |

| Example | Composition FP4/R966/CX-100/SR415/Peroxide | Cross Hatch Adhesion |
|---|---|---|
| Control D | FP4/CX-100 95/5 | Good |
| Control E | FP4/CX-100/SR415/Peroxide 88/5/5/2 | Good |
| 33 | (FP4/R966)/CX-100 (70:30) 95/5 | Good |
| 34 | (FP4/R966)/CX-100/SR415/Peroxide (70:30) 88/5/5/2 | Good |
| 35 | (FP4/R966)/CX-100 (90:10) 95/5 | Good |
| 36 | (FP4/R966)/CX-100/SR415/Peroxide (90:10) 88/5/5/2 | Good |

Peroxide = tert-butyl hydroperoxide
SR415-20 mole ethoxylated trimethylolpropane triacrylate avialave from Sartomer.

Controls D and E demonstrate that the inclusion of the aziridine compound improves the adhesion in the absence of non-fluorinated polymer. Examples 33-36 demonstrate that comparable adhesion can be obtained when the composition further comprises a non-fluorinated polymer, such as a polyurethane, and when the fluoropolymer is cured by peroxide curing and/or by curing with a multi(meth)acrylate.

| Example | Composition (THV 340:R966)/Polyaziridine | Adhesion to THV610 Film (3 days) |
|---|---|---|
| 37 | (70:30) 97/3 (Tris(aziridino) triazine) | Good |
| 38 | (70:30) 95/5 (Tris(aziridino) triazine) | Good |
| 39 | (70:30) 92.5/7.5 (Tris(aziridino) triazine) | Good |
| 40 | (70:30) 97/3 (Tris(aziridino) triazine) | Good |
| 41 | (70:30) 95/5 (Tris(aziridino) triazine) | Good |
| 42 | (70:30) 92.5/7.5 (Tris(aziridino) triazine) | Good |
| 43 | (70:30) 97/3 (Tris(aziridino) triazine) | Good |
| 44 | (70:30) 95/5 (Tris(aziridino) triazine) | Good |
| 45 | (70:30) 92.5/7.5 (Tris(aziridino) triazine) | Good |

| Example | Composition (THV 340Z/THV500 or THV600)/Polyurethane/CX-100) | Bonding To THV610 Film |
|---|---|---|
| 46 | (THV340Z/FP2/R966):CX-100 (49/21/30) 95:5 | Good |
| 47 | (THV340Z/FP2/R966):CX-100 (35/35/30) 95:5 | Good |
| 48 | (THV340Z/FP2/R966):CX-100 (21/49/23) 95:5 | Good |
| 49 | (THV340Z/FP3/R966):CX-100 (49/21/30) 95:5 | Good |
| 50 | (THV340Z/FP3/R966):CX-100 (35/35/30) 95:5 | Good |
| 51 | (THV340Z/FP3/R966):CX-100 (21/49/30) 95:5 | Good |

-continued

| Example | Composition (THV 340Z/THV500 or THV600)/Polyurethane/CX-100) | Bonding To THV610 Film |
|---|---|---|
| 52 | (THV340Z/FP2/R966):CX-100 (27/63/10) 95:5 | Good |
| 53 | (THV340Z/FP3/R966):CX-100 (27/63/10) 95:5 | Good |
| 54 | (FP2/R966):CX-100 (70/30) 95:5 | Good |
| 55 | (FP3/R966):CX-100 (70/30) 95:5 | Good |

For the Examples 48 and 49, the coated PET was laminated to THV610 by pressing at 180 C for 2 minutes. Examples 52 and 53 were heat laminated to THV500 in the same manner and also exhibited good adhesion.

| Example | Composition | Pencil Hardness |
|---|---|---|
| 56 | (THV 340Z/R966(95/5):(5 nm SiO$_2$/2 nm SiO$_2$(3/1):CX-100 85.7/9.5/4.8 | 4H |
| 57 | (THV 340Z/R966(95/5):(5 nm SiO$_2$/2 nm SiO$_2$(3/1):CX-100 57.1/38.0/4.9 | 3H |

Examples 56-58 each contained a blend of THV340Z and R966 at a weight ratio of 95/5; 5 nm SiO$_2$ and 2 nm SiO$_2$ at a weight ratio of 3/1 and CX-100. The total weight percentage of the dried composition is expressed by the final weight ratio. Thus, Example 56 contained 85.7 wt-% solids of the 95/5 blend of THV340Z and R966; 9.5 wt-% solids of the 3/1 blend of 5 nm SiO$_2$ and 2 nm SiO$_2$; and 4.8 wt-% solids of CX-100. Examples 56-57 were also found to exhibit good adhesion to PET.

What is claimed is:

1. A fluoropolymer coating composition comprising:
an aqueous liquid medium;
at least 50 wt. % solids of fluoropolymer particles having a fluorine content of at least 60 wt. % dispersed in the aqueous liquid medium,
up to 50 wt. % of non-fluorinated polymer particles dispersed in the aqueous liquid medium; and
at least one aziridine compound comprising at least two aziridine groups or at least one aziridine group and at least one alkoxy silane group.

2. The fluoropolymer coating composition of claim 1 wherein the aqueous liquid medium is basic.

3. The fluoropolymer coating composition of claim 1 further comprising inorganic oxide nanoparticles.

4. The fluoropolymer coating composition of claim 3 wherein the inorganic oxide nanoparticles comprise silica, clay, or a mixture thereof.

5. The fluoropolymer coating composition of claim 3 wherein the inorganic oxide nanoparticles have an average particle size of less than 100 nm.

6. The fluoropolymer coating composition of claim 1 wherein the aziridine compound has the general structure:

wherein R is a core moiety having a valency of Y;
L is a bond, a divalent atom, or a divalent linking group;
R$_1$, R$_2$, R$_3$, and R$_4$ are independently hydrogen or a C$_1$-C$_4$ alkyl; and
Y ranges from 2 to 6.

7. The fluoropolymer coating composition of claim 6 wherein R-L is a residue of a multi(meth)acrylate compound.

8. The fluoropolymer coating composition of claim 6 wherein the aziridine compound is free of hydrolyzable groups.

9. The fluoropolymer coating composition of claim 8 wherein the aziridine compound is free of ester groups.

10. The fluoropolymer coating composition of claim 1 wherein the aziridine compound has the general structure:

wherein R" is hydrogen or a C$_1$-C$_4$ alkyl;
X is a bond, a divalent atom, or a divalent linking group;
n is 0, 1 or 2;
m is 1, 2, or 3; and
and the sum or n+m is 3.

11. The fluoropolymer coating composition of claim 1 wherein the fluoropolymer comprises 15 to 35 mole-% of monomeric units derived from VF, VDF or a combination thereof.

12. The fluoropolymer coating composition of claim 1 wherein the fluoropolymer comprises at least 45 mole-% of monomeric units derived from TFE.

13. The fluoropolymer coating composition of claim 11 wherein the fluoropolymer further comprises monomeric units derived from HFP.

14. The fluoropolymer coating composition of claim 1 wherein the fluoropolymer comprises at least 50 mole-% of monomeric units derived from VF, VDF or a combination.

15. The fluoropolymer coating composition of claim 1 wherein the fluoropolymer comprises at least 50, 60, or 70 mole-% of repeat units derived from TFE and monomeric units derived from alkyl vinyl ether.

16. The fluoropolymer coating composition of claim 1 wherein the fluoropolymer comprises at least 45 mole-% of repeat units derived from TFE and monomeric units derived from perfluoroalkyl vinyl ether.

17. The fluoropolymer coating composition of claim 1 wherein the non-fluorinated polymers comprise polyurethane polymer, acrylic polymer, or a mixture thereof.

18. The fluoropolymer coating of claim 1 further independently comprising organic cosolvent, inorganic oxide nanoparticles, thickeners, surfactants, pigments, fillers, barrier particles, thermal stabilizers, and light stabilizers.

19. A coated substrate comprising a substrate wherein a surface of the coated substrate comprises a dried coating composition according to claim 1.

20. An article comprising
a substrate wherein a surface of the substrate comprises a coating comprising
at least 50 wt. % fluoropolymer particles having a fluorine content of at least 60 wt. %;
up to 50 wt. % of non-fluorinated polymer particles; and
a reaction product of at least one aziridine compound comprising at least two aziridine groups or at least one aziridine group and at least one alkoxy silane group.

* * * * *